United States Patent [19]

Steim et al.

[11] Patent Number: 4,866,442

[45] Date of Patent: Sep. 12, 1989

[54] ANALOG TO DIGITAL CONVERTER EMPLOYING DELTA-SIGMA MODULATION

[76] Inventors: Joseph M. Steim, R.R. 1, Box 40, Shirley, Mass. 01464; Erhard Wielandt, Huebwiesenstrasse 30, Geroldsvil, Switzerland

[21] Appl. No.: 120,924

[22] Filed: Nov. 16, 1987

Related U.S. Application Data

[63] Continuation-in-part of Ser. No. 57,211, Jun. 1, 1987.

[51] Int. Cl.[4] .............................................. H03M 3/02
[52] U.S. Cl. .................................... 341/143; 341/155; 375/28
[58] Field of Search ................ 340/347 AD, 347 DA, 340/347 CC; 375/28–30, 33; 341/110, 118, 143, 155

[56] References Cited

U.S. PATENT DOCUMENTS

| | | | |
|---|---|---|---|
| 3,825,831 | 7/1974 | Ishiguro | 325/38 B |
| 4,313,204 | 1/1982 | DeFreitas | 375/28 |
| 4,509,037 | 4/1985 | Harris | 340/347 AD |
| 4,518,948 | 5/1985 | VanRoessel | 340/347 NT |
| 4,542,354 | 9/1985 | Robinton | 332/11 D |
| 4,573,037 | 2/1986 | Robinton | 340/347 NT |
| 4,588,981 | 5/1986 | Senn | 340/347 AD |

OTHER PUBLICATIONS

Classen et al., "Signal Processing Method for Improving the Dynamic Range of A/D and D/A Converters," IEEE Transactions on Acoustics, Speech, and Signal Processing, vol. ASSP-28, No. 5, Oct. 1980, pp. 529–537.

Primary Examiner—William M. Shoop, Jr.
Assistant Examiner—Marc S. Hoff
Attorney, Agent, or Firm—Lahive & Cockfield

[57] ABSTRACT

Analog-to-digital conversion apparatus provides high-resolution conversion of input signals. Summing elements combine an analog input signal and an analog offset signal to generate a residual signal. A first integrator element integrates the residual signal, and a second integrator processes the first integrator output signal to produce a second integrator output signal. A comparator processes the first and second integrator output signals to produce a digital offset signal, the second integrator output signal is converted into a digital representation, and output elements process the digital offset signal and second integrator output signal to produce a digital representation of the analog input signal.

31 Claims, 5 Drawing Sheets

ANALOG TO DIGITAL CONVERTER EMPLOYING DELTA-SIGMA MODULATION

REFERENCE TO RELATED APPLICATION

This application is a continuation-in-part of U.S. Ser. No. 057,211, "Method and Apparatus for Seismometry and Signal Processing" filed June 1, 1987, incorporated herein by reference.

BACKGROUND OF THE INVENTION

This invention relates generally to digital encoding of electrical signals, and in particular, provides apparatus for high-resolution analog-to-digital conversion of electrical signals. While applicable to seismic and other dynamic waveform signals, the invention relates also to analog-to-digital encoders used in other applications, and to techniques of high-resolution analog-to-digital conversion in general.

Digital encoding of seismic, sonar, audio, vibrations and other types of broad-band physical signals requires a large dynamic range, greater than 120 dB, extremely low differential non-linearity (often less than a fraction of a part-per-million), and well-defined phase and group delay. Seismic waveforms, for example, comprise a large dynamic range, greater than 140 dB, and frequency content, more than 5 decades. These signals typically do not, however, require commensurate absolute accuracy of the zero-frequency full scale.

Progress has been made in prior-art analog-to-digital encoding devices employing delta sigma modification to achieve high linearity. Improvements over early devices have produced higher loop gain within the desired signal passband by incorporating integrators or low-pass filters within the delta-modulator feedback loop, thus creating a delta-sigma modulator. For a given bit rate, the additional loop gain increases the information content in the delta-modulated serial bit-stream output at frequencies within the signal passband. Double, triple, and higher order implementations of the delta-sigma modulator are used. The following U.S. patents disclose examples of such systems:

| | |
|---|---|
| 3,825,831 | Ishiguro |
| 4,313,204 | DeFreitas |
| 4,509,037 | Harris |
| 4,518,948 | VanRoessel |
| 4,542,354 | Robinton et al. |
| 4,573,037 | Robinton et al. |
| 4,588,981 | Senn |

The Ishiguro patent discloses differential pulse code modulation apparatus including a delta modulator for converting an analog input signal to a delta modulated signal, a digital filter for removing quantization noise components, and a direct feedback pulse code modulation encoder.

The DeFreitas patent discloses apparatus for generating a digitally encoded signal from an analog signal and a reference signal, including a circuit for reducing quantization noise.

The Harris patent discloses an analog-to-digital encoder including a delta modulation encoder. An analog signal and an internal analog signal generated by an internal decoder are summed to provide an internal analog error signal. The encoder also includes a spectrum tilter having at least three integrator circuits and a clipping circuit connected in parallel to two of the three integrator circuits.

The VanRoessel patent discloses an analog-to-digital converter including a series arrangement of an integrating circuit, a comparison circuit, a flip-flop and a gate.

The Robinton ('354) patent discloses a delta-sigma pulse modulator for converting an input signal to an output pulse train having an average amplitude proportional to the input signal. The modulator includes an integrator/comparator circuit.

The Robinton ('037) patent discloses an analog-to-digital converter including an integrator, a comparator, and digital gates for receiving and processing an analog input signal.

The Senn patent discloses a double integration, delta-sigma analog-to-digital converter including first and second adders, first and second integrators, a quantizer circuit, operational amplifiers and switched capacitor circuits.

The above patents accordingly describe apparatus for converting analog input signals to digital output signals. However, prior-art analog-to-digital converters (ADCs) comprising a delta-sigma modulator have a variety of operational deficiencies such as noise and limited dynamic range.

A double-integrator delta-sigma modulator, although an improvement relative to a single-integrator version or a simple delta modulator, requires a loop bit rate on the order of 1000 times the highest signal frequency to achieve 120-140 dB dynamic range. In a converter employing delta-sigma modulation, the loop bit rate should ideally be as low as possible relative to the highest processed signal frequency for several reasons.

In particular, semiconductor analog switches such as Field Effect Transistors (FETs) that are used within the delta-sigma modulator loop introduce errors, essentially noise, because of charge injection each time the switch is operated. The error due to charge injection is proportional to the switching frequency. The number of switchings per unit time, and therefore the loop bit rate, relative to the highest signal frequency should therefore be minimized. Charge injection errors are a principal limitation in delta- and delta-sigma modulators having high dynamic range.

Moreover, a lower loop bit rate demands less numerical computation per unit time in digital filters or other processors receiving the output of the delta-sigma modulator. The time duration of the impulse response of a digital filter associated with a delta-sigma modulator is proportional to a function of the ratio of loop bit rate to highest signal frequency. The time duration of a subsequent digital filter is also proportional to the required degree of suppression by the filter of undesired signals. In particular, the single-bit output of a delta modulator class of device has a large granularity, essentially quantization noise, at the loop bit rate frequency. A digital filter may be used to reduce this noise within the desired signal passband, although to achieve 120-140 dB of dynamic range requires a substantial 120-140 dB of suppression, and an accordingly long filter duration. Excessive group delay accompanying a filter with long duration may, for example, preclude application of the ADC within a closed-loop servo control system, or other real-time application.

A triple, or higher order, delta-sigma modulator has a relatively high information content in the output serial bit stream for a given loop bit rate, but requires some means to suppress meta-stable or unstable oscillation of the delta-sigma feedback loop. Such a high-order loop, in general, violates the Nyquist criterion for stability, and has required, in prior-art devices, a non-linear device that reduces the feedback loop gain momentarily when oscillations increase. This introduces noise within the signal passband, since the delta-sigma loop order is effectively reduced to order 1 or 2, although the loop bit rate remains constant. Furthermore, such a meta-stable loop must be operated with maximum signal levels significantly below the nominal full scale range of the loop so that non-linear loop stabilization is not required frequently. Such operation, however, sacrifices dynamic range for a given implementation.

Additionally, these characteristics of delta-sigma modulation indicate that for a given loop bit rate, the technique requiring the lowest ratio of loop bit rate to maximum signal frequency provides the highest conversion rate. Because actual circuit performance and thus potential fields of application are limited by analog switch charge injection, digital computation rate and digital filter duration, maximum conversion rate and resolution, which is required in applications such as sonar and ultrasound imaging, digital studio audio, vibration analysis, and precision instrumentation, can be achieved only by the technique requiring the lowest relative loop bit rate.

There accordingly exists a need for high-resolution analog-to-digital conversion apparatus characterized by large amplitude and frequency range and low differential non-linearity.

It is thus an object of the invention to provide improved analog-to-digital converter (ADC) apparatus for converting analog input signals to digital output signals.

It is another object of the invention to provide ADC apparatus which is capable of processing signals having a large dynamic range and frequency content.

It is a further object of the invention to provide ADC apparatus having extremely low differential non-linearity, precisely-defined phase delay and minimal group delay.

It is yet another object of the invention to provide ADC apparatus which is suitable for use in processing seismic, audio and other analog signals.

Other general and specific objects of the invention will in part be obvious and will in part appear hereinafter.

SUMMARY OF THE INVENTION

The invention provides analog-to-digital conversion apparatus for receiving an analog input signal and producing a digital output signal. The invention includes an input summing element for receiving an analog input signal and an analog offset signal, and for producing a residual signal in response to an arithmetic combination of the analog input signal and the analog offset signal. The invention also provides a first integrating element, in electrical circuit with the input summing element, for receiving and integrating the produced residual signal to produce a first integrator output signal.

The invention further provides a second integrating element, in electrical circuit with the first integrating element, for receiving and integrating the first integrator output signal to produce a second integrator output signal. An analog-to-digital converter element is connected in electrical circuit with the second integrating element, for receiving the second integrator output signal and for producing a digital representation of the second integrator output signal.

In another aspect of the invention, the input summing element and the first integrating element are combined in a single circuit block, are electrically balanced and directly receive a differential analog input signal.

A further aspect of the invention provides a comparator element having a one-bit sampling analog-to-digital converter. The one-bit sampling analog-to-digital converter includes a comparator for comparing the first integrator output signal and the second integrator output signal, and a digital sampling element, in circuit with the comparator, for receiving the output of the comparator and for producing in response thereto a one-bit digital offset signal.

In another aspect of the invention, the analog-to-digital converter element can have a multiple-bit digital output, and the comparator element for comparing the first and second integrator output signals can be either digital or analog. Moreover, the first or second integrating elements can be digital or analog.

A further aspect of the invention provides an analog-to-digital converter element connected in electrical circuit with both the first and second integrator elements, for receiving a combined integrator output signal representative of an arithmetic combination of the first integrator output signal and the second integrator output signal, and for producing a digital representation of the combined integrator output signal. The arithmetic combination can be a combination, in any proportion, of the first and second integrator output signals, including in limiting cases sampling only the first integrator output or the second integrator output.

The invention also includes a comparator element adapted for producing a multiple-bit digital offset signal, and a digital-to-analog offset element adapted for generating the analog offset signal in response to the multiple-bit digital offset signal.

In another aspect of the invention, the summing section contains elements for summing the analog offset signal and the analog input signal, and the output section contains differencing elements for subtracting a digital representation of the analog offset signal from the digital representation of the analog input signal.

The invention accordingly comprises apparatus embodying features of construction, combinations of elements and arrangements of parts as exemplified in the following detailed disclosure, and the scope of the invention is indicated in the claims.

BRIEF DESCRIPTION OF THE DRAWINGS

For a fuller understanding of the nature and objects of the invention, reference should be made to the following detailed description and the accompanying drawings, in which.

DESCRIPTION OF ILLUSTRATED EMBODIMENTS

Figure 1:
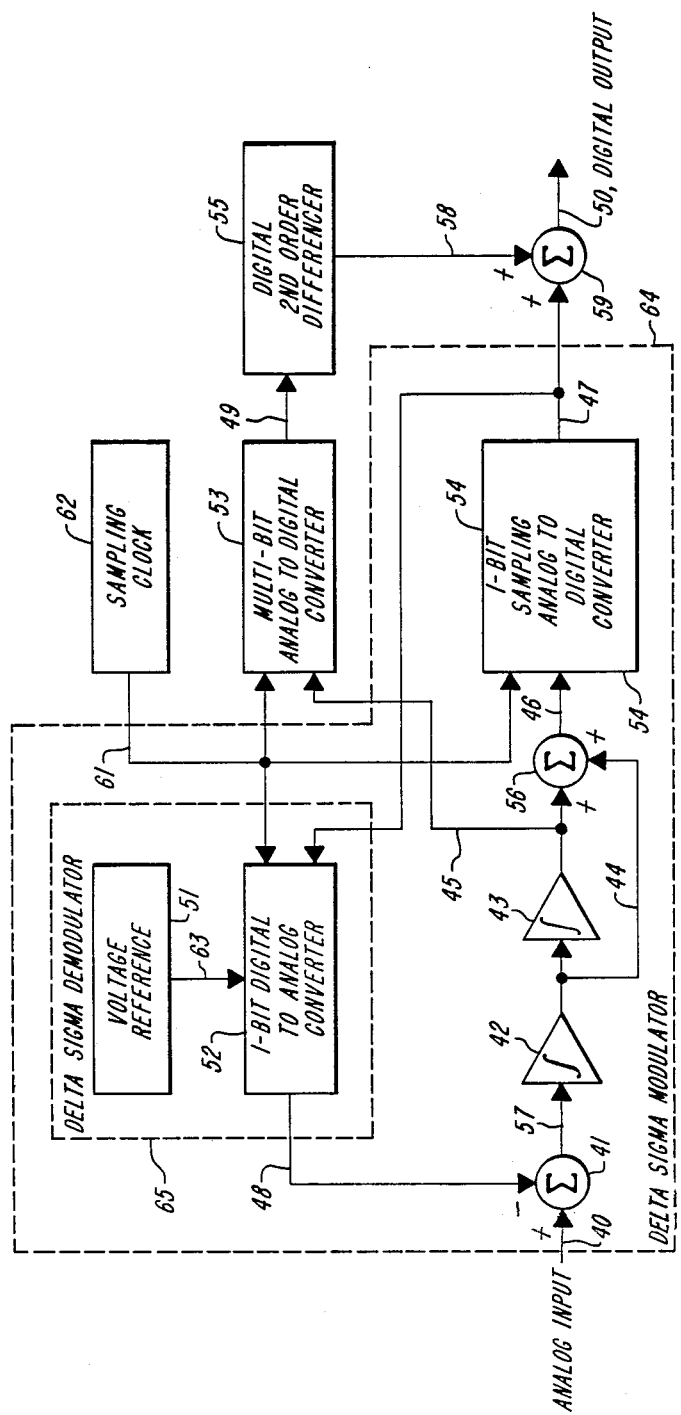
FIG. 1 is a block diagram of an analog to digital converter (ADC) according to the invention, wherein a multiple bit ADC element samples the output of a second integrator stage.

FIG. 1 is block diagram of analog to digital converter (ADC) according to the invention. The analog signal 40 enters the analog summer 41 where it is summed with the output 48 of the 1-bit digital to analog converter (DAC) 52. The error signal 57 is integrated by the first integrator 42 and by the second integrator 43. The outputs 44 and 45 of the first and second integrators are summed in analog summer 56, creating a signal 46 that is transmitted to the 1-bit sampling ADC 54, which in turn generates the 1-bit signal 47 that is received by the digital summer 59 and by the 1-bit DAC 52. The loop thus closed forms a double-integrator delta-sigma modulator 64.

The sampling ADC 53 samples the twice-integrated error signal 45 at the loop bit rate and converts it with N bits of resolution to digital representation. N may be any positive integer, but in typical realizations of the invention, N has ranged from 8 to 16 to achieve the necessary resolution. The digital output 49 of ADC 53 is received by the digital differencer 55 where it is second differenced in order to represent digitally the error signal 57 before integration. The second-differenced signal 58 is digitally added to the 1-bit digital signal 47 to create the digital representation 50 of the analog input signal 40. The digital representation 50 of the analog input 40 is constructed according to the expression:

$$50_n = 49_n - 49_{n-1} - (49_{n-1} - 49_{n-2}) + 47_{n-1}$$

where $50_n$, $49_n$, and $47_n$, respectively, represent the value of signals 50, 49 and 47 at sample n, and $50_{n-1}$, $49_{n-1}$ and $47_{n-1}$ represent the value of signals 50, 49 and 47 at sample n−1.

An important feature of the invention is the multi-bit ADC element 53, that distinguishes the invention from prior-art delta- and delta-sigma modulators. While a standard delta modulator must operate at a high loop bit rate to make the error signal 45 as small as possible, the invention requires only that the error signal 45 remain within the measurable range of the ADC 53. The invention allows a larger loop error signal to accumulate, but, because the error signal is measured rather than forced to zero, the requirements on the loop gain and loop bit rate of the modulator are relaxed.

The digital second differencer 55 and summer 59 merge the digital bit stream signal 47—whose average value represents the input signal 40—with the digitized error signal to construct a digital representation of the analog input. The digital bit stream signal is a digital representation of the offset signal 48 that is subtracted from the analog input signal.

The invention provides, without certain limitations of prior-art techniques, conversion of broad-band waveforms with high dynamic range. The invention employs double-integrator delta-sigma modulator 64 to achieve 120–140 dB of dynamic range with a loop bit rate of approximately 100 times the highest frequency of interest. This is a substantially lower ratio than that of a conventional double-integrator delta-sigma modulator, and requires less computation using a shorter-duration filter than a delta-sigma modulator of higher order. There is no loss of resolution or increase of the converter noise floor arising from non-linear methods required to suppress instability in the higher-order systems typical of the prior art.

For a given loop bit rate, the invention requires less computation in subsequent digital filters to achieve a specified suppression of out-of-band granular noise than that required by a single-bit delta- or delta-sigma modulator of any order. The invention utilizes the sampling analog-to-digital converter 54 to measure the integrated error signal within a delta-sigma modulator feedback loop with N binary bits of dynamic range and resolution where N is a positive integer.

In an ordinary delta- or delta-sigma modulator, the single-bit serial output stream is dependent only upon the polarity of the error signal; the amplitude of the error signal is discarded. We have found, however, that considerable information that permits construction of a digital representation of the analog input signal is contained in a measurement of the amplitude of the error signal. In accordance with the invention, therefore, the integrated loop error signal 45 is digitized by sampling A/D converter 53 to N bits, differenced by digital differencer 55, and added to the 1-bit output of the delta-sigma modulator 64 to provide a high-resolution digital output 50. If the delta-sigma modulator output 47 has a dynamic range equivalent to M bits, the digital output signal 50 may have a dynamic range and resolution equivalent to as much as M+N bits within the desired signal passband. This dynamic range is recoverable through subsequent digital filtration to remove the delta-sigma modulator granular noise outside the signal passband.

The embodiment illustrated in FIG. 1 also provides apparatus for extension of the dynamic range and resolution of a standard A/D converter, having N bits of dynamic range. As discussed above, the delta-sigma modulator 64 generates an analog offset signal 48, having M bits of dynamic range, that is subtracted from the analog input signal 40 to create an analog difference signal 57. The analog difference signal 57 is integrated twice and digitized by the A/D converter 54 to N bits of resolution. A digital representation 50 of the analog input signal 40, having N+M bits of dynamic range, is constructed by adding the digital representation 47 of the offset signal 48 supplied by the delta-sigma modulator 64 to a numerically differenced, electrically integrated, digitized difference signal 58.

An important feature of the invention is that the difference signal 57 is integrated in two integrator 42 and 43 before digitization by the A/D converter 54. The integration provides high gain at frequencies within the signal passband, which is a fraction of the loop bit rate frequency, without potential saturation at high frequencies. The increased low-frequency gain reduces quantization noise for signals at the frequencies of interest.

Thus, the invention, which can be viewed either as an extension of the dynamic range and efficiency of a delta-sigma modulator by measurement of the loop error signal, or as an extension of the dynamic range of an A/D converter by subtraction of an offset signal that is generated by a delta-sigma modulator, yields a greater combined dynamic range and differential linearity than either device in dependently. The invention provides, for a given dynamic range, a minimum loop bit rate, and thus the lowest potential for charge injection errors, in an unconditionally stable delta-sigma loop.

Those skilled in the art will understand that while FIG. 1 shows the multiple-bit ADC 53 configured for sampling the output signal 45 of second integrator 43 only, ADC 53 can be configured to sample any arithmetic combination of the first and second integrator output signals 44 and 45, including, in the limiting case, sampling only one of the two integrator output signals 44 and 45. In addition, while the invention is described in connection with analog integrators, alternatively, the integrator elements represented by blocks 42 and 43 can be digital in operation, and can have conventional ADC elements incorporated into their respective input lines.

Figure 2:
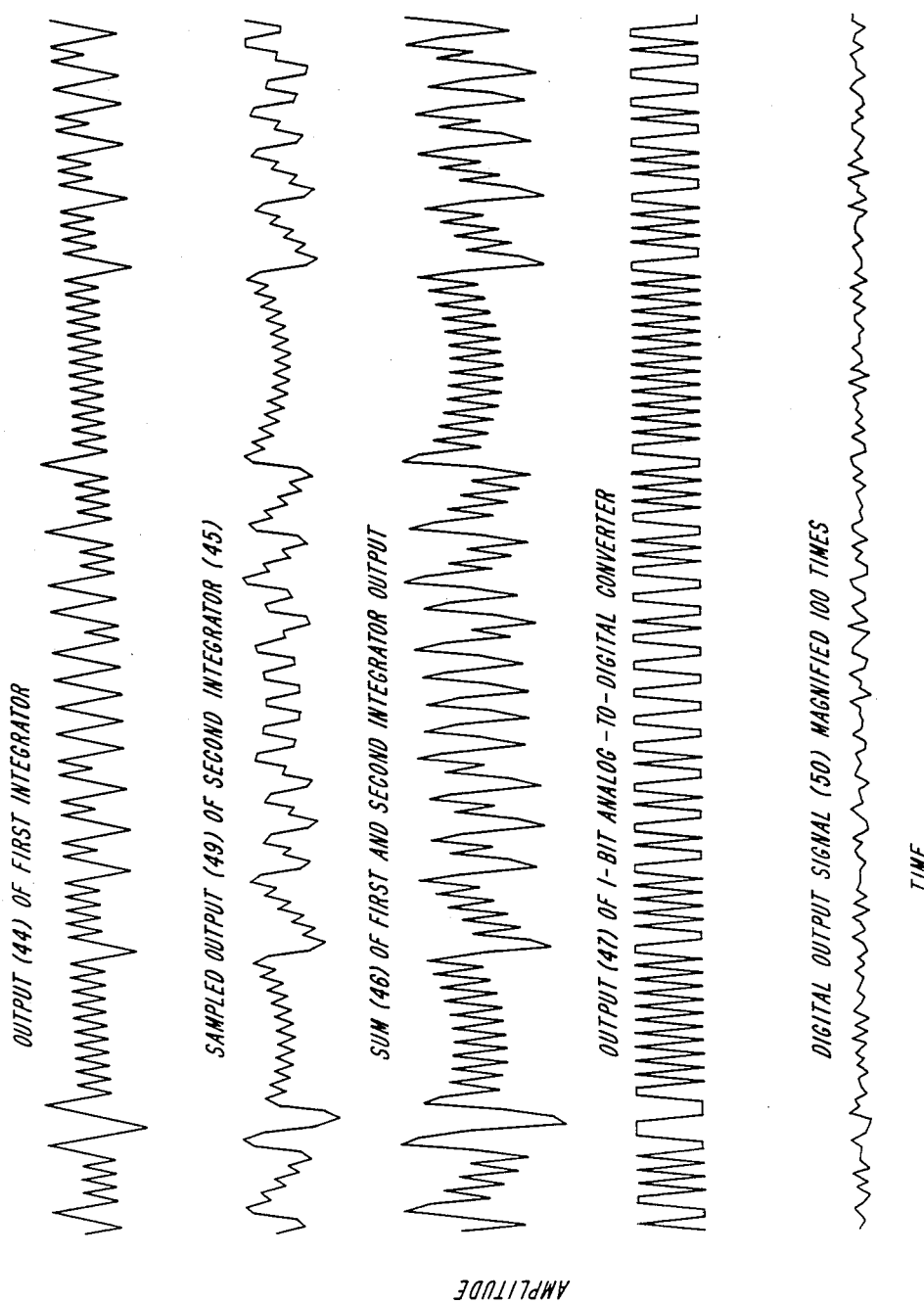
FIG. 2 represents internal voltage vs. time waveforms at various junctions within the apparatus of FIG. 1.
Figure 3:
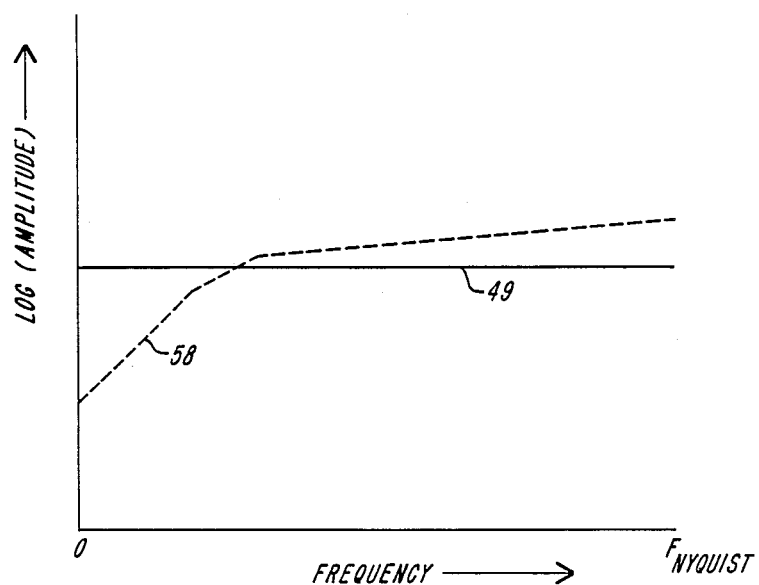
FIG. 3 shows a spectrum of the quantization noise of the multi-bit ADC before and after differencing by the digital second differencer of FIG. 1.

FIG. 2 illustrates for an embodiment utilizing analog integrators, voltage-to-time waveforms at the output 44 of the first integrator; at the output 45 of the second integrator, sampled by the multi-bit A/D converter 53; at the output of analog summer 56, which is also the input of the 1-bit A/D 54; at the output 47 of the 1-bit A/D 54; and at the output 50 of the digital summer 59. The digital output signal 50 is magnified 100 times in FIG. 2 relative to the signals 44, 49, 46, 47. It is apparent from FIG. 2 that the granular noise in the digital output signal 50 is of order 1000 times smaller than the 1-bit output 47 of the delta-sigma modulator. In addition, the spectrum of the noise at 50 is reduced at low frequencies, as shown in FIG. 3. Subsequent digital low-pass filtration of the digital output 50 can provide increased dynamic range and reduced quantization noise at frequencies low relative to the loop bit rate. Below roughly 0.01 of the loop bit rate, actual dynamic range may be expected to exceed 130–140 dB.

FIG. 3 shows the action of the second differencer 55 (shown in FIG. 1) on the signal 49, transmitted to differencer 55 by multi-bit ADC element 53. This quantization noise spectrum of signal 49 is frequency independent, as reflected by the horizontal amplitude to frequency plot. The quantization noise spectrum of the differenced signal 58, however, is reduced at frequencies low relative to the loop bit rate. $F_{Nyquist}$, as known in the art, is ½ the loop bit rate frequency.

Figure 4:
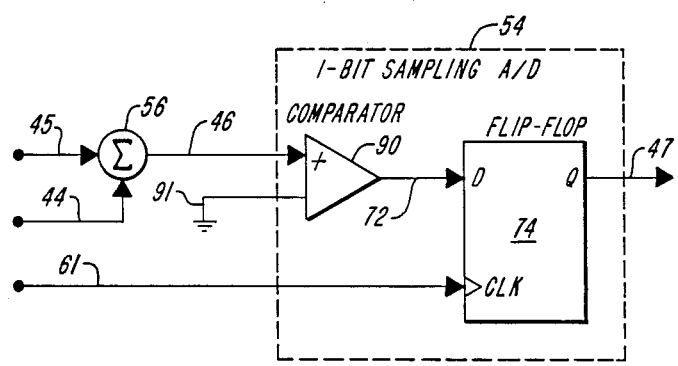
FIG. 4 is a block diagram of a preferred embodiment of a one-bit sampling ADC element utilized in the embodiment shown in FIG. 1.

FIG. 4 shows a preferred embodiment of the 1-bit sampling A/D converter 54. The first and second integrator output signals 44 and 45 are summed by adder 56, producing signal 46. Signal 46 is transmitted t the "+" input of comparator 90 of sampling ADC 54. Comparator 90 compares the value of signal 46 with that of reference signal 91 to produce comparator result 72. The sampling clock signal 61 clocks the comparator result 72 present at the D input of flip-flop 74 to the flip-flop's Q output, where the one-bit value of the comparator output 72 is stored until the next active transition of the sampling clock. The same sampling clock controls sampling by the multi-bit ADC 53. Those skilled in the art will understand that in an embodiment utilizing digital integrator elements, comparator 90 can be configured to operate on digital input signals, and block 54 can be configured to execute sampling without analog-to-digital conversion.

Figure 5:
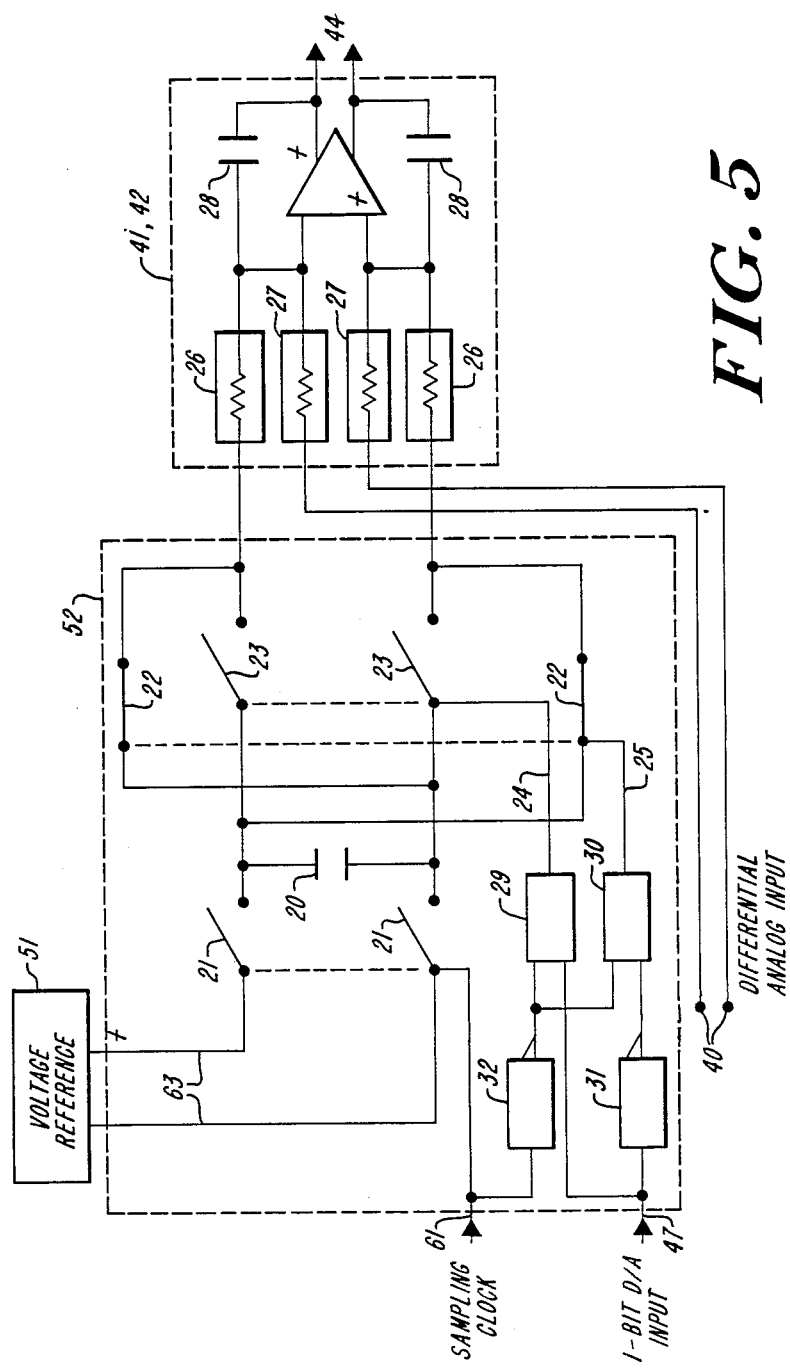
FIG. 5 shows a preferred embodiment of a 1-bit digital to analog converter (DAC), analog summer and first integrator.

A further aspect of the invention, illustrated in FIG. 5, includes an electrically-balanced fully-differential 1-bit digital-to-analog converter 52, analog summer 41, and analog integrator 42 which compensate for charge injection errors caused by unbalanced switches. The illustrated analog summer 41 includes a switched capacitor network. The sampling clock 61, which also controls sampling by the ADCs 53 and 54, alternately charges through switches 21 a capacitor 20 from a voltage reference 51, and discharges the capacitor 20 through switches 22 or 23 into resistors 26 of the analog summer and first integrator 41, 42. The differential analog input is summed directly through resistors 27 of the analog summer and first integrator 41, 42. The charge stored on capacitor 20 is thus transferred to integrating capacitors 28, to complete a clocked digital-to-analog conversion of the 1-bit input 47, which controls the polarity of discharge of capacitor 20 into the analog summer and firs integrator.

Logic implemented by inverters 31, 32 and gates 29, 30 provide that the discharge paths through switches 22 and 23 are not active while switch 21 is closed, i.e., during charging of the capacitor 20.

Those skilled in the art will understand that resistors 26 and 27 can be replaced with a switched capacitor network. Moreover, other embodiments of the invention may include operation of the 1-bit DAC 52 as a switched current source by deleting switches 21 and capacitor 20, and converting voltage reference 51 to a current source. In other embodiments of the invention the 1-bit DAC 52 can be replaced by a converter having more quantization levels.

This feature of the invention permits achievement of low broad-band noise, a low temperature coefficient of drift, and relative insensitivity to variation in component characteristics and to their change with time. The circuit illustrated in FIG. 5 is an electrically-balanced, fully differential circuit that features high common mode rejection. The circuit also provides compensation to first order of charge injection by the analog switches, because the switches are always active, and only the polarity is modulated.

Those skilled in the art will understand that alternative embodiments of the invention may implement the analog summer 56, integrators 42 and 43, and 1-bit DAC 52 as a single-ended circuit. A single-ended circuit embodiment of the invention would use fewer components and be more easily implemented as a monolithic or hybrid component, possibly at the expense of increased thermal coefficient of drift and first-order sensitivity to component variations.

Figure 6:
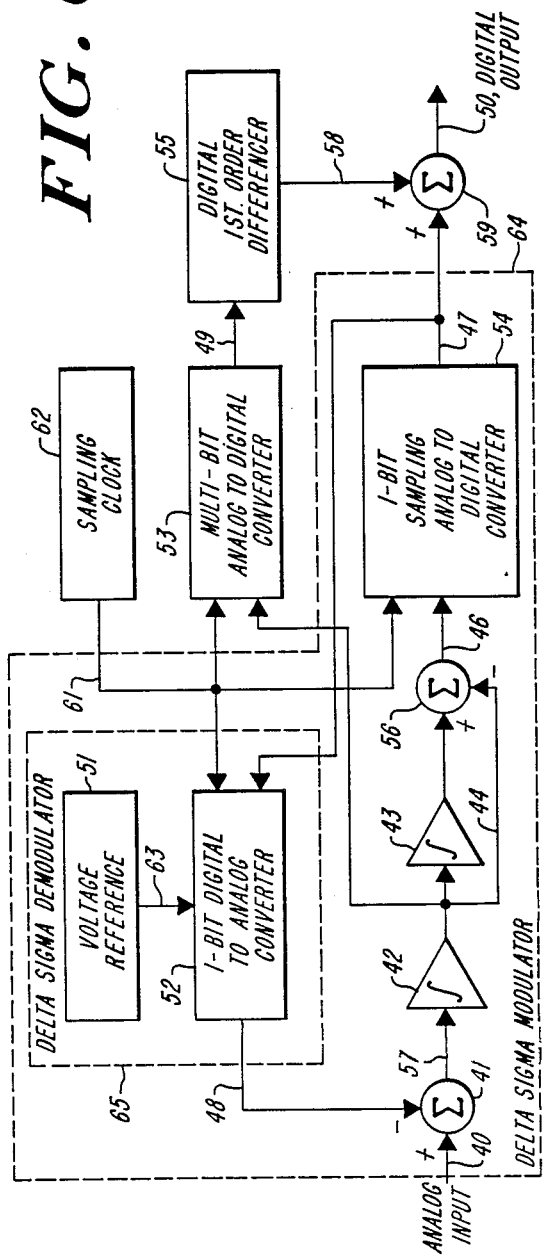
FIG. 6 is a block diagram of another embodiment of an ADC according to the invention, wherein the sampling multiple-bit analog to digital element samples the output of the first integrator.

While optimum reduction of quantization noise of the digitized signal 49 is achieved for a given loop bit rate by sampling the output signal 45 of the second integrator 43, in another embodiment of the invention, the output 44 of the first integrator 42 is sampled. This embodiment of the invention is illustrated in FIG. 6. The embodiment of FIG. 6 is otherwise identical to that described above in connection with FIG. 1. The embodiment shown in FIG. 6 has two principal advantages over that shown in FIG. 1. The first advantage is that a fast, accurate sample-and-hold amplifier is not required for sampling the output 44 of first integrator 42. In the embodiment illustrated in FIG. 1, sampling the output 45 of the second integrator requires a fast and accurate sample-and-hold amplifier because signal 45 slews rapidly. Those skilled in the art will recognize that in general, the slew rate of second integrator output 45 is much higher than that of the input signal 40.

Moreover, in the embodiment shown in FIG. 6, a less complex first-difference expression is calculated to derive the digital output signal 50. In the notation used above in connection with FIG. 1, this expression is:

$$50_n = 49_n - 49_{n-1} + 47_{n-1}$$

In the embodiment shown in FIG. 6, the first differencing operation reduces quantization noise at frequencies low relative to the loop bit rate as illustrated in FIG. 3 for the embodiment sampling second integrator output 45, but the reduction is less pronounced.

Figure 7:
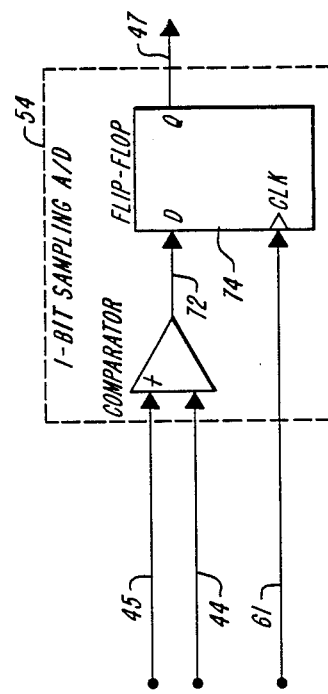
FIG. 7 is a block diagram of another embodiment a one-bit ADC element utilized in the embodiments of FIGS. 1 or 6, having a comparator element with positive and negative inputs.

FIG. 7 shows an alternate embodiment of the 1-bit sampling ADC Converter 54. The outputs 44 and 45 of the first and second integrators are received by the positive and negative inputs of the comparator. The embodiment shown in FIG. 7 is otherwise substantially identical to that shown in FIG. 4.

It will thus be seen that the invention efficiently attains the objects set forth above, among those made apparent from the preceding description. In particular, the invention provides high-resolution analog-to-digital conversion apparatus having low differential non-linearity, capable of processing signals having a large dynamic range and frequency content, such as seismic and audio signals.

It will be understood that changes may be made in the above construction and in the foregoing sequences of operation without departing from the scope of the invention. Those skilled in the art will understand, for example, that the multiple-bit ADC 53 can be configured for sampling any arithmetic combination of the first and second integrator output signals 44 and 45. Moreover, while a one-bit sampling ADC 54 is illustrated, a multiple-bit ADC can be employed to generate a multiple-bit digital signal 47. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. Analog-to-digital conversion apparatus comprising
   A. input summing means for receiving an analog input signal and an analog offset signal and producing a residual signal in response to an arithmetic combination of said analog input signal and said analog offset signal,
   B. first integrating means, in electrical circuit with said input summing means, for receiving and integrating said produced residual signal to produce a first integrator output signal,
   C. second integrating means, in electrical circuit with said first integrating means, for receiving and integrating said first integrator output signal to produce a second integrator output signal,
   D. analog-to-digital converter means, in electrical circuit with said second integrating means, for receiving said second integrator output signal and producing a digital representation of said second integrator output signal,
   E. comparator means, in electrical circuit with said first integrating means and said second integrating means, for comparing said first integrator output signal and said second integrator output signal, and producing in response thereto a digital offset signal,
   F. digital-to-analog offset means, in electrical circuit with said comparator means and said input summing means, for receiving said digital offset signal produced by said comparator means, producing in response thereto said analog offset signal, and transmitting said analog offset signal to said input summing means, and
   G. output means, in electrical circuit with said analog-to-digital converter means and said comparator means, for respectively receiving therefrom said digital representation of said second integrator output signal and said digital offset signal, and for producing in response thereto a digital representation of said analog input signal.

2. Analog-to-digital conversion apparatus according to claim 1, wherein said input summing means and said first integrating means are electrically balanced and directly receive a differential input signal.

3. Analog-to-digital conversion apparatus according to claim 2, wherein said comparator means comprises a one-bit sampling analog-to-digital converter, said analog-to-digital converter including
   (i) a comparator for comparing said first integrator output signal and said second integrator output signal, and
   (ii) digital sampling means, in circuit with said comparator, for receiving the output of said comparator and producing in response thereto a one-bit digital offset signal.

4. Analog-to-digital conversion apparatus according to claim 3 wherein said analog-to-digital converter means includes means for producing a multiple-bit digital output.

5. Analog-to-digital conversion apparatus according to claim 3 wherein said comparator means includes a digital comparator, and wherein at least one of said first and second integrating means includes a digital integrator.

6. Analog-to-digital conversion apparatus according to claim 3, wherein said comparator means includes an analog comparator, and wherein at least one of said first and second integrating means includes an analog integrator.

7. Analog-to-digital conversion apparatus according to claim 3, wherein said comparator means includes means for producing a multiple-bit digital offset signal, and wherein said digital-to-analog offset means includes means for generating said analog offset signal in response to said multiple-bit digital offset signal.

8. Analog-to-digital conversion apparatus according to claim 2, wherein said analog-to-digital converter means includes means for producing a multiple-bit digital output.

9. Analog-to-digital conversion apparatus according to claim 2, wherein said comparator means includes a digital comparator, and wherein at least one of said first and second integrating means includes a digital integrator.

10. Analog-to-digital conversion apparatus according to claim 2, wherein said comparator means includes an analog comparator, and wherein at least one of said first and second integrating means includes an analog integrator.

11. Analog-to-digital conversion apparatus according to claim 2, wherein said comparator means includes means for producing a multiple-bit digital offset signal, and wherein said digital-to-analog offset means includes means for generating said analog offset signal in response to said multiple-bit digital offset signal.

12. Analog-to-digital conversion apparatus according to claim 1, wherein said comparator means comprises a one-bit sampling analog-to-digital converter, said analog-to-digital converter including
   (i) a comparator for comparing said first integrator output signal and said second integrator output signal, and
   (ii) digital sampling means, in circuit with said comparator, for receiving the output of said comparator and producing in response thereto a one-bit digital offset signal.

13. Analog-to-digital conversion apparatus according to wherein said analog-to-digital converter means includes means for producing a multiple-bit digital output.

14. Analog-to-digital conversion apparatus according to claim 12, wherein said comparator means includes a digital comparator, and wherein at least one of said first and second integrating means includes a digital integrator.

15. Analog-to-digital conversion apparatus according to claim 12, wherein said comparator means includes an analog comparator, and wherein at least one of said first and second integrating means includes an analog integrator.

16. Analog-to-digital conversion apparatus according to claim 12, wherein said comparator means includes means for producing a multiple-bit digital offset signal, and wherein said digital-to-analog offset means includes means for generating said analog offset signal in response to said multiple-bit digital offset signal.

17. Analog-to-digital conversion apparatus according to claim 1, wherein said analog-to-digital converter means includes means for producing a multiple-bit digital output.

18. Analog-to-digital conversion apparatus according to claim 1, wherein said comparator means includes a digital comparator, and wherein at least one of said first and second integrating means includes a digital integrator.

19. Analog-to-digital conversion apparatus according to claim 1, wherein said comparator means includes an analog comparator, and wherein at least one of said first and second integrating means includes an analog integrator.

20. Analog-to-digital conversion apparatus according to claim 19, wherein said comparator means includes means for producing a multiple-bit digital offset signal, and wherein said digital-to-analog offset means includes means for generating said analog offset signal in response to said multiple-bit digital offset signal.

21. Analog-to-digital conversion apparatus according to claim 1, wherein said comparator means includes means for producing a multiple-bit digital offset signal, and wherein said digital-to-analog offset means includes means for generating said analog offset signal in response to said multiple-bit digital offset signal.

22. Analog-to-digital conversion apparatus comprising
   A. input summing means for receiving an analog input signal and an analog offset signal and producing a residual signal in response to an arithmetic combination of said analog input signal and said analog offset signal,
   B. first integrating means, in electrical circuit with said input summing means, for receiving and integrating said produced residual signal to produce a first integrator output signal,
   C. second integrating means, in electrical circuit with said first integrating means, for receiving and integrating said first integrator output signal to produce a second integrator output signal, at least one of said first and second integrating means including a digital integrator,
   D. analog-to-digital converter means, in electrical circuit with said second integrating means, for receiving said second integrator output signal and producing a digital representation of said second integrator output signal,
   E. comparator means, including a digital comparator, in electrical circuit with said first integrating means and said second integrating means, for comparing said first integrator output signal and said second integrator output signal, and producing in response thereto, a multiple-bit digital offset signal,
   F. digital-to-analog offset means, in electrical circuit with said comparator means and said input summing means, for receiving said multiple-bit digital offset signal produced by said comparator means, generating said analog offset signal in response to said multiple-bit digital offset signal, and transmitting said analog offset signal to said input summing means, and
   G. output means, in electrical circuit with said analog-to-digital converter means and said comparator means, for respectively receiving therefrom said digital representation of said second integrator output signal and said digital offset signal, and for producing in response thereto a digital representation of said analog input signal.

23. Analog-to-digital conversion apparatus comprising
   A. input summing means for receiving an analog input signal and an analog offset signal and producing a residual signal in response to an arithmetic combination of said analog input signal and said analog offset signal,
   B. first integrating means, in electrical circuit with said input summing means, for receiving and integrating said produced residual signal to produce a first integrator output signal,
   C. second integrating means, in electrical circuit with said first integrating means, for receiving and integrating said first integrator output signal to produce a second integrator output signal,
   D. analog-to-digital converter means, in electrical circuit with first integrating means and said second integrating means, for receiving a combined integrator output signal representative of an arithmetic combination of said first integrator output signal and said second integrator output signal, and producing a digital representation of said combined integrator output signal,
   E. comparator means, in electrical circuit with said first integrating means and said second integrating means, for comparing said first integrator output signal and said second integrator output signal, and producing in response thereto a digital offset signal,
   F. digital-to-analog offset means, in electrical circuit with said comparator means and said input summing means, for receiving said digital offset signal produced by said comparator means, producing in response thereto said analog offset signal, and transmitting said analog offset signal to said input summing means, and G. output means, in electrical circuit with said analog-to-digital converter means and said comparator means, for respectively receiving therefrom said digital representation of said combined integrator output signal and said digital offset signal, and producing in response thereto a digital representation of said analog input signal.

24. Analog-to-digital conversion apparatus according to claim 23, wherein said input summing means and said first integrating means are electrically balanced.

25. Analog-to-digital conversion apparatus according to claim 24, wherein said input summing means and said first integrating means receive a differential input signal.

26. Analog-to-digital conversion apparatus according to claim 25, wherein said comparator means comprises a one-bit sampling analog-to-digital converter, said analog-to-digital converter including
  (i) a comparator for comparing said first integrator output signal and said second integrator output signal, and
  (ii) digital sampling means, in circuit with said comparator, for receiving the output of said comparator and producing in response thereto a one-bit digital offset signal.

27. Analog-to-digital conversion apparatus according to claim 23, wherein said analog-to-digital converter means includes means for producing a multiple-bit digital output.

28. Analog-to-digital conversion apparatus according to claim 23, wherein said comparator means includes a digital comparator, and wherein at least one of said first and second integrating means includes a digital integrator.

29. Analog-to-digital conversion apparatus according to claim 23, wherein said comparator means includes an analog comparator, and wherein at least one of said first and second integrating means includes an analog integrator.

30. Analog-to-digital conversion apparatus according to claim 23, wherein said comparator means includes means for producing a multiple-bit digital offset signal, and wherein said digital-to-analog offset means includes means for generating said analog offset signal in response to said multiple-bit digital offset signal.

31. Analog-to-digital conversion apparatus comprising
  A. input summing means for receiving an analog input signal and an analog offset signal and producing a residual signal in response to an arithmetic combination for said analog input signal and said analog offset signal, wherein said input summing means contains means for summing said analog offset signal and said analog input signal,
  B. first integrating means, in electrical circuit with said input summing means, for receiving and integrating said produced residual signal to produce a first integrator output signal,
  C. second integrating means, in electrical circuit with said first integrating means, for receiving and integrating said first integrator output signal to produce a second integrator output signal,
  D. analog-to-digital converter means, in electrical circuit with said second integrating means, for receiving said second integrator output signal and producing a digital representation of said second integrator output signal,
  E. comparator means, in electrical circuit with said first integrating means and said second integrating means, for comparing said first integrator output signal and said second integrator output signal, and producing in response thereto a digital offset signal,
  F. digital-to-analog offset means, in electrical circuit with said comparator means and said input summing means, for receiving said digital offset signal produced by said comparator means, producing in response thereto said analog offset signal, and transmitting said analog offset signal to said input summing means, and
  G. output means, in electrical circuit with said analog-to-digital converter means and said comparator means, for respectively receiving therefrom said digital representation of said second integrator output signal and said digital offset signal, and for producing in response thereto a digital representation of said analog input signal, wherein said output means contains means for subtracting a digital representation of said analog offset signal from said digital representation of said analog input signal.

* * * * *